(12) United States Patent
Arimilli et al.

(10) Patent No.: US 7,117,319 B2
(45) Date of Patent: Oct. 3, 2006

(54) MANAGING PROCESSOR ARCHITECTED STATE UPON AN INTERRUPT

(75) Inventors: Ravi Kumar Arimilli, Austin, TX (US); Robert Alan Cargnoni, Austin, TX (US); Guy Lynn Guthrie, Austin, TX (US); William John Starke, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 768 days.

(21) Appl. No.: 10/313,321

(22) Filed: Dec. 5, 2002

(65) Prior Publication Data

US 2004/0111572 A1  Jun. 10, 2004

(51) Int. Cl.
*G06F 12/00* (2006.01)
(52) U.S. Cl. .................................... 711/156
(58) Field of Classification Search ............... None
See application file for complete search history.

(56) References Cited

U.S. PATENT DOCUMENTS

| | | | |
|---|---|---|---|
| 4,484,274 A * | 11/1984 | Berenbaum et al. | 718/108 |
| 5,057,997 A * | 10/1991 | Chang et al. | 718/108 |
| 5,987,495 A * | 11/1999 | Ault et al. | 718/108 |
| 6,026,471 A | 2/2000 | Goodnow et al. | |
| 6,189,112 B1 | 2/2001 | Slegel et al. | |
| 6,247,109 B1 | 6/2001 | Kleinsorge et al. | |
| 6,308,290 B1 | 10/2001 | Forlenza et al. | |
| 6,981,083 B1 * | 12/2005 | Arimilli et al. | 710/260 |

FOREIGN PATENT DOCUMENTS

| | | |
|---|---|---|
| JP | PUPA S60-027031 | 2/1985 |
| JP | PUPA S60-164840 | 8/1985 |
| JP | PUPA S61-241838 | 10/1986 |
| JP | PUPA H03-201032 | 9/1991 |
| JP | PUPA H04-288625 | 10/1992 |

* cited by examiner

*Primary Examiner*—Mano Padmanabhan
*Assistant Examiner*—Midys Rojas
(74) *Attorney, Agent, or Firm*—Casimer K. Salys; Dillon & Yudell LLP

(57) ABSTRACT

A method and system are disclosed for managing a hard architected state of a processor that is critical for executing a process in the processor. A shadow copy of the hard architected state is stored from the processor to memory when an interrupt is received by the processor. The shadow copy of the hard architected permits rapid saving of the hard architected state for the interrupted process, so that the architected state of a next process can be immediately stored in the processor.

21 Claims, 15 Drawing Sheets

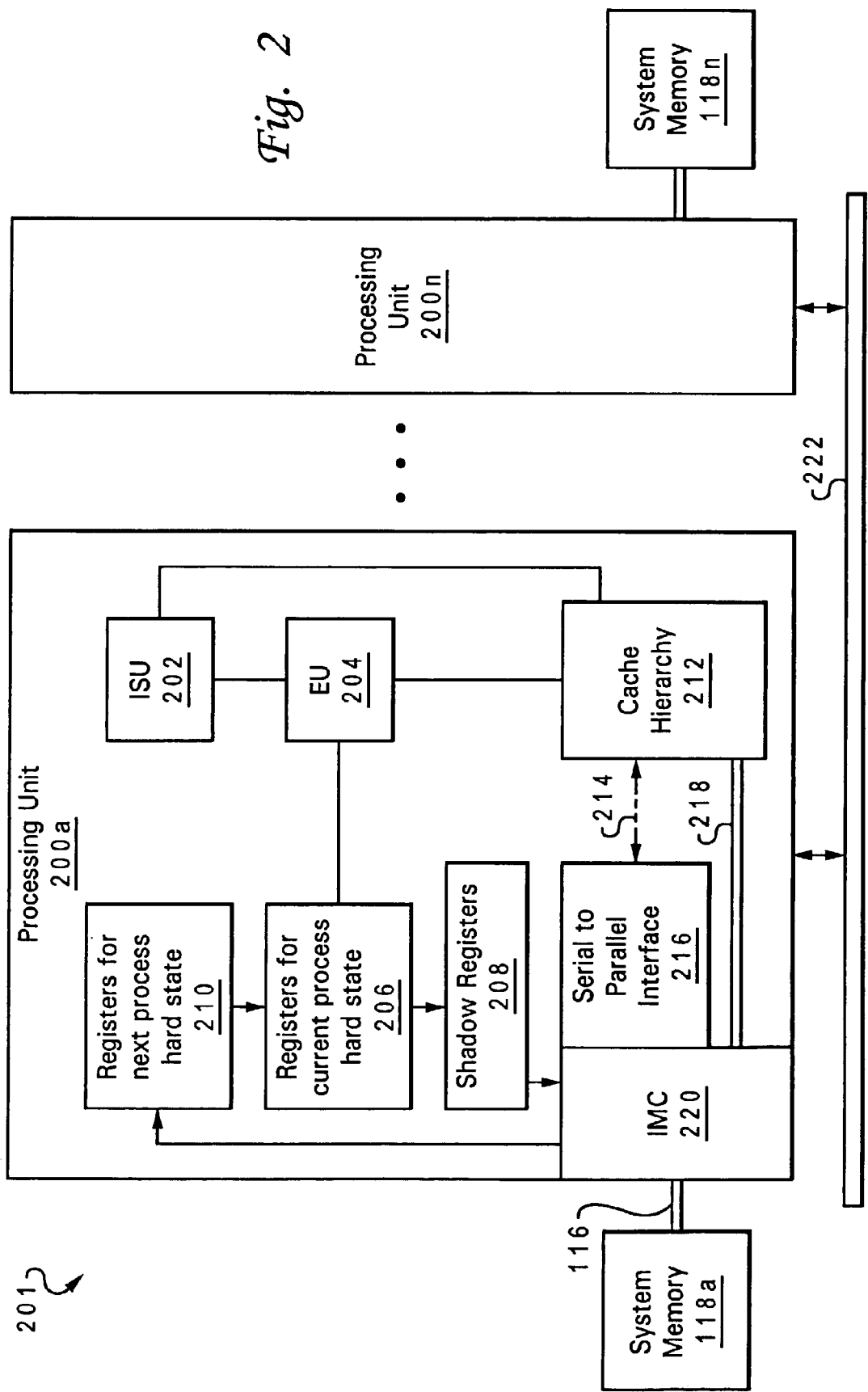

MANAGING PROCESSOR ARCHITECTED STATE UPON AN INTERRUPT

The present invention is related to the subject matter of the following commonly assigned, copending United States patent applications which are filed on even date herewith: Ser. No. 10/313,319; Ser. No. 10/313,329; Ser. No. 10/313,330; Ser. No. 10/313,320; Ser. No. 10/313,301; and Ser. No. 10/313,308. The content of the above-referenced applications are incorporated herein by reference in their entireties.

BACKGROUND OF THE INVENTION

1. Technical Field

The present invention relates in general to the field of data processing, and, in particular, to an improved data processing system and method for handling interrupts.

2. Description of the Related Art

When executing a set of computer instructions, a processor is frequently interrupted. This interruption may be caused by an interrupt or an exception.

An interrupt is an asynchronous interruption event that is not associated with the instruction that is executing when the interrupt occurs. That is, the interruption is often caused by some event outside the processor, such as an input from an input/output (I/O) device, a call for an operation from another processor, etc. Other interrupts may be caused internally, for example, by the expiration of a timer that controls task switching.

An exception is a synchronous event that arises directly from the execution of the instruction that is executing when the exception occurs. That is, an exception is an event from within the processor, such as an arithmetic overflow, a timed maintenance check, an internal performance monitor, an on-board workload manager, etc. Typically, exceptions are far more frequent than interrupts.

The terms "interrupt" and "exception" are often interchanged. For the purposes of this disclosure, the term "interrupt" will be used to describe both "interrupt" and "exception" interruptions.

As computer software and hardware have become more complex, the number and frequency of interrupts has increased dramatically. These interrupts are necessary, in that they support the execution of multiple processes, handling of multiple peripherals, and performance monitoring of various components. While such features are beneficial, the consumption of computing power by interrupts is increasing so dramatically that it is outstripping processing speed improvements of the processor(s). Thus, in many cases system performance is actually decreasing in real terms despite increasing processor clock frequencies.

FIG. 1 illustrates a conventional processor core 100. Within processor core 100, a Level 1 Instruction cache (L1 I-cache) 102 provides instructions to instruction sequencing logic 104, which issues the instructions to the appropriate execution units 108 for execution. Execution units 108, which may include a floating point execution unit, a fixed point execution unit, a branch execution unit, etc., include a load/store unit (LSU) 108a. LSU 108a executes load and store instructions, which load data from Level 1 Data cache (L1 D-cache) 112 into architected register 110 and store data from architected register 110 to L1 D-cache 112, respectively. Requests for data and instructions that miss L1 caches 102 and 112 can be resolved by accessing system memory 118 via memory bus 116.

As noted above, processor core 100 is subject to interrupts from a number of sources represented by external interrupt lines 114. When an interrupt signal is received by processor core 100 (e.g., via one of the interrupt lines 114), execution of current process(es) are suspended and the interrupt is handled by interrupt-specific software known as an interrupt handler. Among other activities, the interrupt handler saves and restores the architected state of the process executing at the time of the interrupt through the execution of store and load instructions by LSU 108a. This use of LSU 108a to transfer the architected state to and from system memory 118 blocks execution of other memory access instructions by the interrupt handler, (or another process in the case of a superscalar computer) until the state transfer is complete. Consequently, saving and subsequently restoring the architected states of a process through the execution units of the processor causes a delay in execution of both the interrupted process as well as the interrupt handler. This delay results in a degradation of the overall performance of the processor. Thus, the present invention recognizes that there is a need for a method and system that minimize the processing delay incurred by saving and restoring architected states, particularly in response to interrupt.

SUMMARY OF THE INVENTION

The present invention is directed to methods and systems for improving interrupt handling within a processor of a data processing system.

When an interrupt signal is received at the processor, a hard architected state of a currently executing process is loaded into one or more dedicated shadow registers. The hard architected state includes information within the processor that is essential for execution of the interrupted process. A beneficial method of further saving this hard architected state includes the use of a high-bandwidth bus to directly transfer the hard architected state from the shadow register(s) to a system memory, without using (and thus tying up) the normal load/store pathway and execution units of the processor. After the hard architected state has been loaded into the shadow register(s), the interrupt handler immediately begins to run. The soft state of the process, including cache contents, is also at least partially saved to system memory. To accelerate the saving of the soft state, and to avoid data collisions with the executing interrupt handler, the soft state is preferably transferred from the processor using scan chain pathways, which in the prior art are used only during manufacturer testing and are unused during normal operation.

Upon completion of the interrupt handler, the hard architected state and soft state are restored for an interrupted process, which is able to run immediately upon loading of the hard architected state.

To afford access to other processors and other partitions possibly running different operating systems, both the hard and soft states may be stored in a reserved area of system memory that is accessible to any processor and/or partition.

The above, as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 2 illustrates a block diagram of an exemplary embodiment of a data processing system in accordance with the present invention;

DETAILED DESCRIPTION OF THE PREFERRED EMBODIMENT

Figure 1:
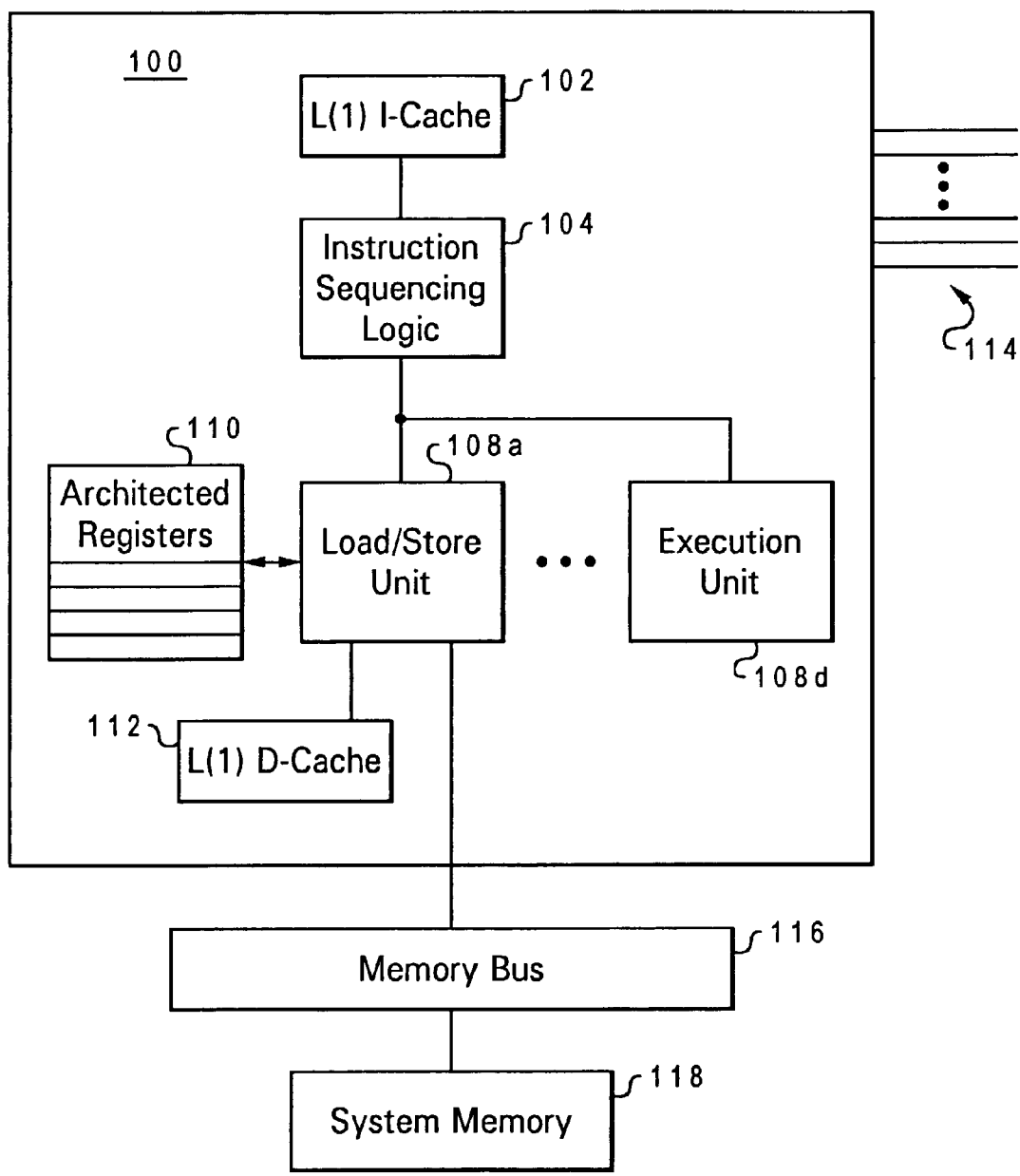
FIG. 1 depicts a block diagram of a conventional computer system that employs a prior art method for saving the architected state of the processor using a load/store unit.

With reference now to FIG. 2, there is depicted a high level block diagram of an exemplary embodiment of a multiprocessor (MP) data processing system 201. While MP data processing system 201 is depicted as a symmetrical multiprocessor (SMP), the present invention may be utilized with any MP data processing system known to those skilled in the art of computer architecture, including but not limited to a non-uniform memory access (NUMA) MP or a Cache Only Memory Architecture (COMA) MP.

In accordance with the present invention, MP data processing system 201 includes a plurality of processing units 200, depicted as processing units 200a to 200n, that are coupled for communication by an interconnect 222. In a preferred embodiment, it is understood that each processing unit 200, including processing unit 200a and processing unit 200n, in MP data processing system 201 is architecturally similar or the same. Processing unit 200a is a single integrated circuit superscalar processor, which, as discussed further below, includes various execution units, registers, buffers, memories, and other functional units that are all formed by integrated circuitry. In MP data processing system 201, each processing unit 200 is coupled by a high bandwidth private bus 116 to respective system memory 118, depicted as system memory 118a for processing unit 200a and system memory 118n for processing unit 200n.

Processing unit 200a includes an instruction sequencing unit (ISU) 202, which includes logic for fetching, scheduling and issuing instructions to be executed by execution unit (EU) 204. Details of ISU 202 and EU 204 are given in exemplary form in FIG. 3.

Associated with EU 204 are "hard" state registers 206 containing the information within processing unit 200a that is essential for executing the currently executing process coupled to hard state register 206 are next hard state registers 210, containing, containing the hard state for the next process to be executed, for example, when the current process terminates or is interrupted. Also associated with hard state registers 206 are shadow registers 208, which contain (or will contain) a copy of the contents of hard state registers 206 when the currently executing process terminates or is interrupted.

Each processing unit 200 further includes a cache hierarchy 212, which may include multiple levels of cache memory. An on-chip storage of instructions and data loaded from system memories 118 may be accomplished by, for example, cache hierarchy 212, which may comprise a Level-one Instruction cache (L1 I-cache) 18, a Level one Data cache (L1 D-cache) 20, and a unified Level two cache (L2 cache) 16 as shown in FIG. 3. Cache hierarchy 212 is coupled to an on-chip integrated memory controller (IMC) 220 for system memory 118 via cache data path 218, and in accordance with at least one embodiment, scan chain pathway 214. As scan chain pathway 214 is a serial pathway, serial-to-parallel interface 216 is coupled between scan chain pathway 214 and IMC 220. The functions of the depicted components of processing unit 200a are detailed below.

Figure 3A:
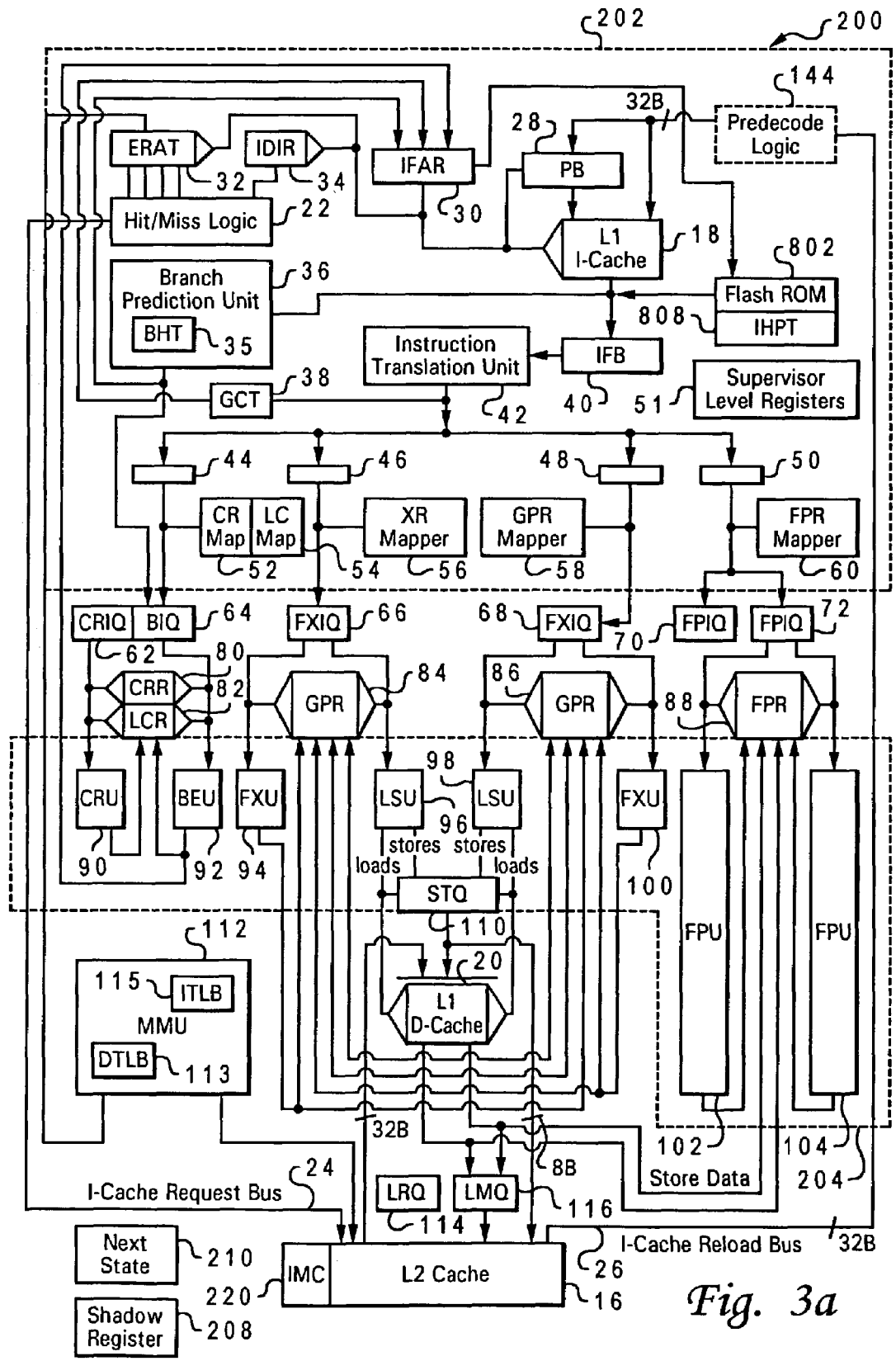
FIGS. 3a and 3b depict additional detail of a processing unit illustrated in FIG. 2.

Reference is now made to FIG. 3a, which shows additional detail for processing unit 200. Processing unit 200 includes an on-chip multi-level cache hierarchy including a unified level two (L2) cache 16 and bifurcated level one (L1) instruction (I) and data (D) caches 18 and 20, respectively. As is well-known to those skilled in the art, caches 16, 18 and 20 provide low latency access to cache lines corresponding to memory locations in system memories 118.

Instructions are fetched for processing from L1 I-cache 18 in response to the effective address (EA) residing in instruction fetch address register (IFAR) 30. During each cycle, a new instruction fetch address maybe loaded into IFAR 30 from one of three sources: branch prediction unit (BPU) 36, which provides speculative target path and sequential addresses resulting from the prediction of conditional branch instructions, global completion table (GCT) 38, which provides flush and interrupt addresses, and branch execution unit (BEU) 92, which provides non-speculative addresses resulting from the resolution of predicted conditional branch instructions. Associated with BPU 36 is a branch history table (BHT) 35, in which are recorded the resolutions of conditional branch instructions to aid in the prediction of future branch instructions.

An effective address (EA), such as the instruction fetch address within AFAR 30, is the address of data or an instruction generated by a processor. The EA specifies a segment register and offset information within the segment. To access data (including instructions) in memory, the EA is converted to a real address (RA), through one or more levels of translation, associated with the physical location where the data or instructions are stored.

Within processing unit 200, effective-to-real address translation is performed by memory management units (MMUs) and associated address translation facilities. Preferably, a separate MMU is provided for instruction accesses and data accesses. In FIG. 3a, a single MMU 112 is illustrated, for purposes of clarity, showing connections only to ISU 202. However, it is understood by those skilled in the art that MMU 112 also preferably includes connections (not shown) to load/store units (LSUs) 96 and 98 and other components necessary for managing memory accesses. MMU 112 includes data translation lookaside buffer (DTLB) 113 and instruction translation lookaside buffer (ITLB) 115. Each TLB contains recently referenced page table entries, which are accessed to translate EAs to RAs for data (DTLB 113) or instructions (ITLB 115). Recently referenced EA-to-RA translations from ITLB 115 are cached in EOP effective-to-real address table (ERAT) 32.

If hit/miss logic 22 determines, after translation of the EA contained in IFAR 30 by ERAT 32 and lookup of the real address (RA) in I-cache directory 34, that the cache line of instructions corresponding to the EA in IFAR 30 does not reside in L1 I-cache 18, then hit/miss logic 22 provides the RA to L2 cache 16 as a request address via I-cache request bus 24. Such request addresses may also be generated by prefetch logic within L2 cache 16 based upon recent access patterns. In response to a request address, L2 cache 16 outputs a cache line of instructions, which are loaded into prefetch buffer (PB) 28 and L1 I-cache 18 via I-cache reload bus 26, possibly after passing through optional predecode logic 144.

Once the cache line specified by the EA in IFAR 30 resides in L1 cache 18, L1 I-cache 18 outputs the cache line to both branch prediction unit (BPU) 36 and to instruction fetch buffer (IFB) 40. BPU 36 scans the cache line of instructions for branch instructions and predicts the outcome of conditional branch instructions, if any. Following a branch prediction, BPU 36 furnishes a speculative instruction fetch address to IFAR 30, as discussed above, and passes the prediction to branch instruction queue 64 so that the accuracy of the prediction can be determined when the conditional branch instruction is subsequently resolved by branch execution unit 92.

IFB 40 temporarily buffers the cache line of instructions received from L1 I-cache 18 until the cache line of instructions can be translated by instruction translation unit (ITU) 42. In the illustrated embodiment of processing unit 200, ITU 42 translates instructions from user instruction set architecture (UISA) instructions into a possibly different number of internal ISA (IISA) instructions that are directly executable by the execution units of processing unit 200. Such translation maybe performed, for example, by reference to microcode stored in a read-only memory (ROM) template. In at least some embodiments, the UISA-to-IISA translation results in a different number of IISA instructions than UISA instructions and/or IISA instructions of different lengths than corresponding UISA instructions. The resultant IISA instructions are then assigned by global completion table 38 to an instruction group, the members of which are permitted to be dispatched and executed out-of-order with respect to one another. Global completion table 38 tracks each instruction group for which execution has yet to be completed by at least one associated EA, which is preferably the EA of the oldest instruction in the instruction group.

Following UISA-to-IISA instruction translation, instructions are dispatched to one of latches 44, 46, 48 and 50, possibly out-of-order, based upon instruction type. That is, branch instructions and other condition register (CR) modifying instructions are dispatched to latch 44, fixed-point and load-store instructions are dispatched to either of latches 46 and 48, and floating-point instructions are dispatched to latch 50. Each instruction requiring a rename register for temporarily storing execution results is then assigned one or more rename registers by the appropriate one of CR mapper 52, link and count (LC) register mapper 54, exception register (XER) mapper 56, general-purpose register (GPR) mapper 58, and floating-point register (FPR) mapper 60.

The dispatched instructions are then temporarily placed in an appropriate one of CR issue queue (CRIQ) 62, branch issue queue (BIQ) 64, fixed-point issue queues (FXIQs) 66 and 68, and floating-point issue queues (FPIQs) 70 and 72. From issue queues 62, 64, 66, 68, 70 and 72, instructions can be issued opportunistically to the execution units of processing unit 10 for execution as long as data dependencies and antidependencies are observed. The instructions, however, are maintained in issue queues 62–72 until execution of the instructions is complete and the result data, if any, are written back, in case any of the instructions needs to be reissued.

As illustrated, the execution units of processing unit 204 include a CR unit (CRU) 90 for executing CR-modifying instructions, a branch execution unit (BEU) 92 for executing branch instructions, two fixed-point units (FXUs) 94 and 100 for executing fixed-point instructions, two load-store units (LSUs) 96 and 98 for executing load and store instructions, and two floating-point units (FPUs) 102 and 104 for executing floating-point instructions. Each of execution units 90–104 is preferably implemented as an execution pipeline having a number of pipeline stages.

During execution within one of execution units 90–104, an instruction receives operands, if any, from one or more architected and/or rename registers within a register file coupled to the execution unit. When executing CR-modifying or CR-dependent instructions, CRU 90 and BEU 92 access the CR register file 80, which in a preferred embodiment contains a CR and a number of CR rename registers that each comprise a number of distinct fields formed of one or more bits. Among these fields are LT, GT, and EQ fields that respectively indicate if a value (typically the result or operand of an instruction) is less than zero, greater than zero, or equal to zero. Link and count register (LCR) register file 82 contains a count register (CTR), a link register (LR) and rename registers of each, by which BEU 92 may also resolve conditional branches to obtain a path address. General-purpose register files (GPRs) 84 and 86, which are synchronized, duplicate register files, store fixed-point and integer values accessed and produced by FXUs 94 and 100 and LSUs 96 and 98. Floating-point register file (FPR) 88, which like GPRs 84 and 86 may also be implemented as duplicate sets of synchronized registers, contains floating-point values that result from the execution of floating-point instructions by FPUs 102 and 104 and floating-point load instructions by LSUs 96 and 98.

After an execution unit finishes execution of an instruction, the execution notifies GCT 38, which schedules completion of instructions in program order. To complete an instruction executed by one of CRU 90, FXUs 94 and 100 or FPUs 102 and 104, GCT 38 signals the execution unit, which writes back the result data, if any, from the assigned rename register(s) to one or more architected registers within the appropriate register file. The instruction is then removed from the issue queue, and once all instructions within its instruction group have completed, is removed from GCT 38. Other types of instructions, however, are completed differently.

When BEU 92 resolves a conditional branch instruction and determines the path address of the execution path that should be taken, the path address is compared against the speculative path address predicted by BPU 36. If the path addresses match, no further processing is required. If, however, the calculated path address does not match the predicted path address, BEU 92 supplies the correct path address to IFAR 30. In either event, the branch instruction can then be removed from BIQ 64, and when all other instructions within the same instruction group have completed, from GCT 38.

Following execution of a load instruction, the effective address computed by executing the load instruction is translated to a real address by a data ERAT (not illustrated) and then provided to L1 D-cache 20 as a request address. At this point, the load instruction is removed from FXIQ 66 or 68 and placed in load reorder queue (LRQ) 114 until the indicated load is performed. If the request address misses in L1 D-cache 20, the request address is placed in load miss queue (LMQ) 116, from which the requested data is retrieved from L2 cache 16, and failing that, from another processing unit 200 or from system memory 118 (shown in FIG. 2). LRQ 114 snoops exclusive access requests (e.g., read-with-intent-to-modify), flushes or kills on interconnect 222 fabric (shown in FIG. 2) against loads in flight, and if a hit occurs, cancels and reissues the load instruction. Store instructions are similarly completed utilizing a store queue (STQ) 110 into which effective addresses for stores are loaded following execution of the store instructions. From STQ 110, data can be stored into either or both of L1 D-cache 20 and L2 cache 16.

Processor States

The state of a processor includes stored data, instructions and hardware states at a particular time, and are herein defined as either being "hard" or "soft." The "hard" state is defined as the information within a processor that is architecturally required for a processor to execute a process from its present point in the process. The "soft" state, by contrast, is defined as information within a processor that would improve efficiency of execution of a process, but is not required to achieve an architecturally correct result. In processing unit 200 of FIG. 3a, the hard state includes the contents of user-level registers, such as CRR 80, LCR 82, GPRs 84 and 86, FPR 88, as well as supervisor level registers 51. The soft state of processing unit 200 includes both "performance-critical" information, such as the contents of L-1 I-cache 18, L-1 D-cache 20, address translation information such as DTLB 113 and ITLB 115, and less critical information, such as BHT 35 and all or part of the content of L2 cache 16.

Registers

In the description above, register files of processing unit 200 such as GPR 86, FPR 88, CRR 80 and LCR 82 are generally defined as "user-level registers," in that these registers can be accessed by all software with either user or supervisor privileges. Supervisor level registers 51 include those registers that are used typically by an operating system, typically in the operating system kernel, for such operations as memory management, configuration and exception handling. As such, access to supervisor level registers 51 is generally restricted to only a few processes with sufficient access permission (i.e., supervisor level processes).

Figure 3B:
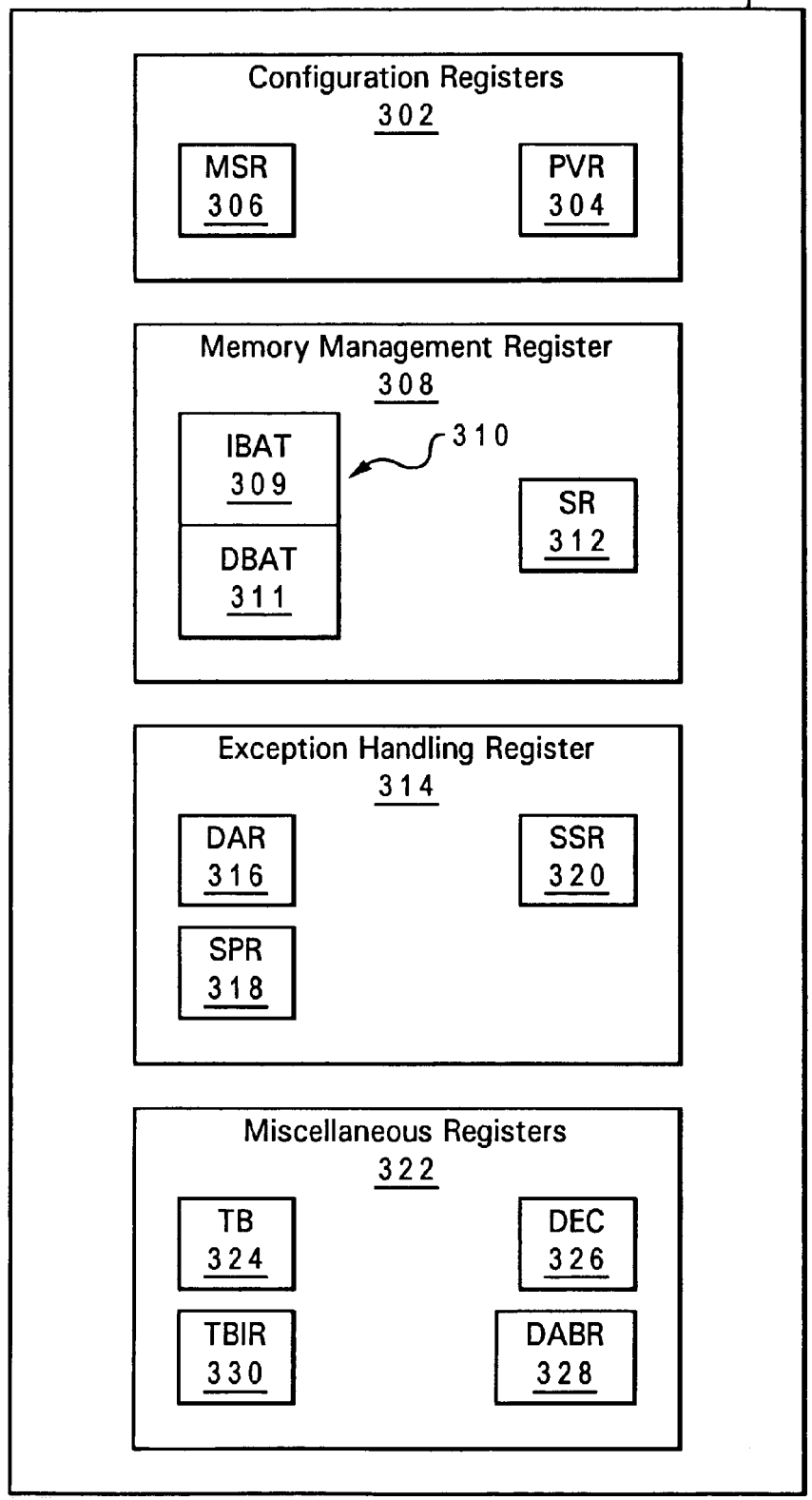

As depicted in FIG. 3b, supervisor level registers 51 generally include configuration registers 302, memory management registers 308, exception handling registers 314, and miscellaneous registers 322, which are described in more detail below.

Configuration registers 302 include a machine state register (MSR) 306 and a processor version register (PVR) 304. MSR 306 defines the state of the processor. That is, MSR 306 identifies where instruction execution should resume after an instruction interrupt (exception) is handled. PVR 304 identifies the specific type (version) of processing unit 200.

Memory management registers 308 include block-address translation (BAT) registers 310. BAT registers 310 are software-controlled arrays that store available block-address translations on-chip. Preferably, there are separate instruction and data BAT registers, shown as IBAT 309 and DBAT 311. Memory management registers also include segment registers (SR) 312, which are used to translate EAs to virtual addresses (VAs) when BAT translation fails.

Exception handling registers 314 include a data address register (DAR) 316, special purpose registers (SPRs) 318, and machine status save/restore (SSR) registers 320. The DAR 316 contains the effective address generated by a memory access instruction if the access causes an exception, such as an alignment exception. SPRs are used for special purposes defined by the operating system, for example, to identify an area of memory reserved for use by a first-level exception handler (FLIH). This memory area is preferably unique for each processor in the system. An SPR 318 may be used as a scratch register by the FLIH to save the content of a general purpose register (GPR), which can be loaded from SPR 318 and used as a base register to save other GPRs to memory. SSR registers 320 save machine status on exceptions (interrupts) and restore machine status when a return from interrupt instruction is executed.

Miscellaneous registers 322 include a time base (TB) register 324 for maintaining the time of day, a decrementer register (DEC) 326 for decrementing counting, and a data address breakpoint register (DABR) 328 to cause a breakpoint to occur if a specified data address is encountered. Further, miscellaneous registers 322 include a time based interrupt register (TBIR) 330 to initiate an interrupt after a pre-determined period of time. Such time based interrupts may be used with periodic maintenance routines to be run on processing unit 200.

Software Organization

Figure 4:
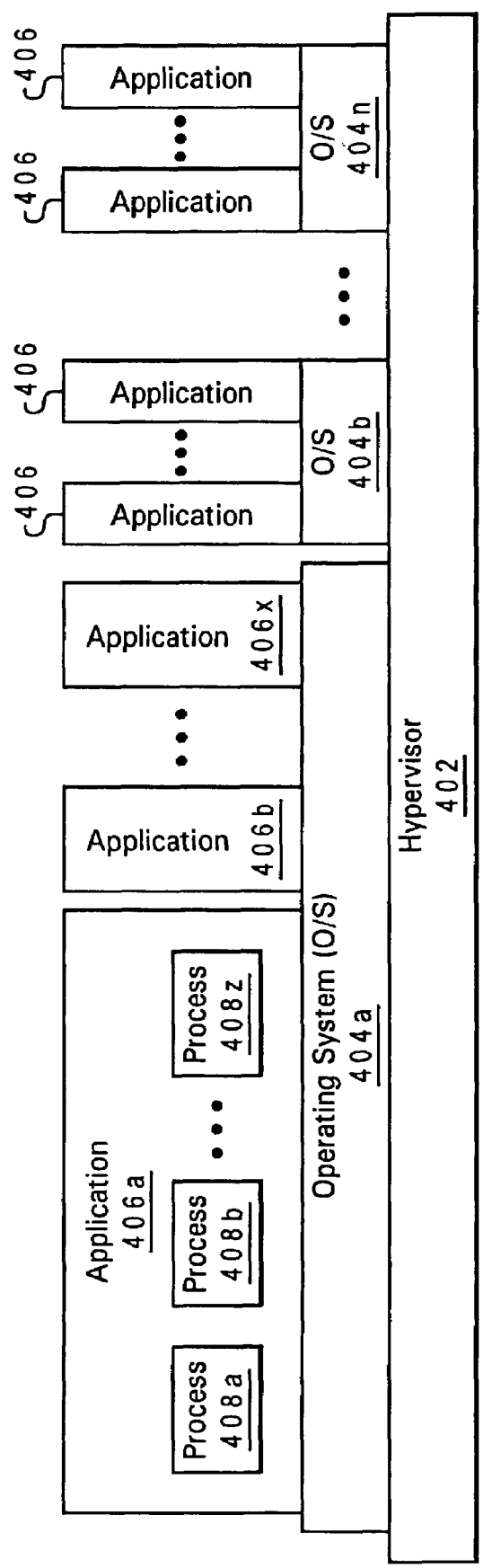
FIG. 4 illustrates a layer diagram of an exemplary software configuration in accordance with the present invention.

In a MP data processing system such as MP data processing system 201 of FIG. 2, multiple applications can run simultaneously, possibly under different operating systems. FIG. 4 depicts a layer diagram of an exemplary software configuration of MP data processing system 201 in accordance with the present invention.

As illustrated, the software configuration includes a hypervisor 402, which is supervisory software that allocates the resources of MP data processing system 201 into multiple partitions, and then coordinates execution of multiple (possibly different) operating systems within the multiple partitions. For example, hypervisor 402 may allocate processing unit 200a, a first region of system memory 118a, and other resources to a first partition in which operating system 404a operates. Similarly, hypervisor 402 may allocate processing unit 200n, a second region of system memory 118n, and other resources to a second partition in which operating system 404n operates.

Running under the control of an operating system 404 may be multiple applications 406, such as a word processor, a spreadsheet, a browser, etc. For example, applications 406a through 406x all run under the control of operating system 404a.

Each operating system 404 and application 406 typically comprise multiple processes. For example, application 406a is shown having multiple processes 408a through 408z. Each processing unit 200 is capable of independently executing a process, assuming that the processing unit 200 has the requisite instructions, data and state information for the process.

Interrupt Handling

Figure 5A:
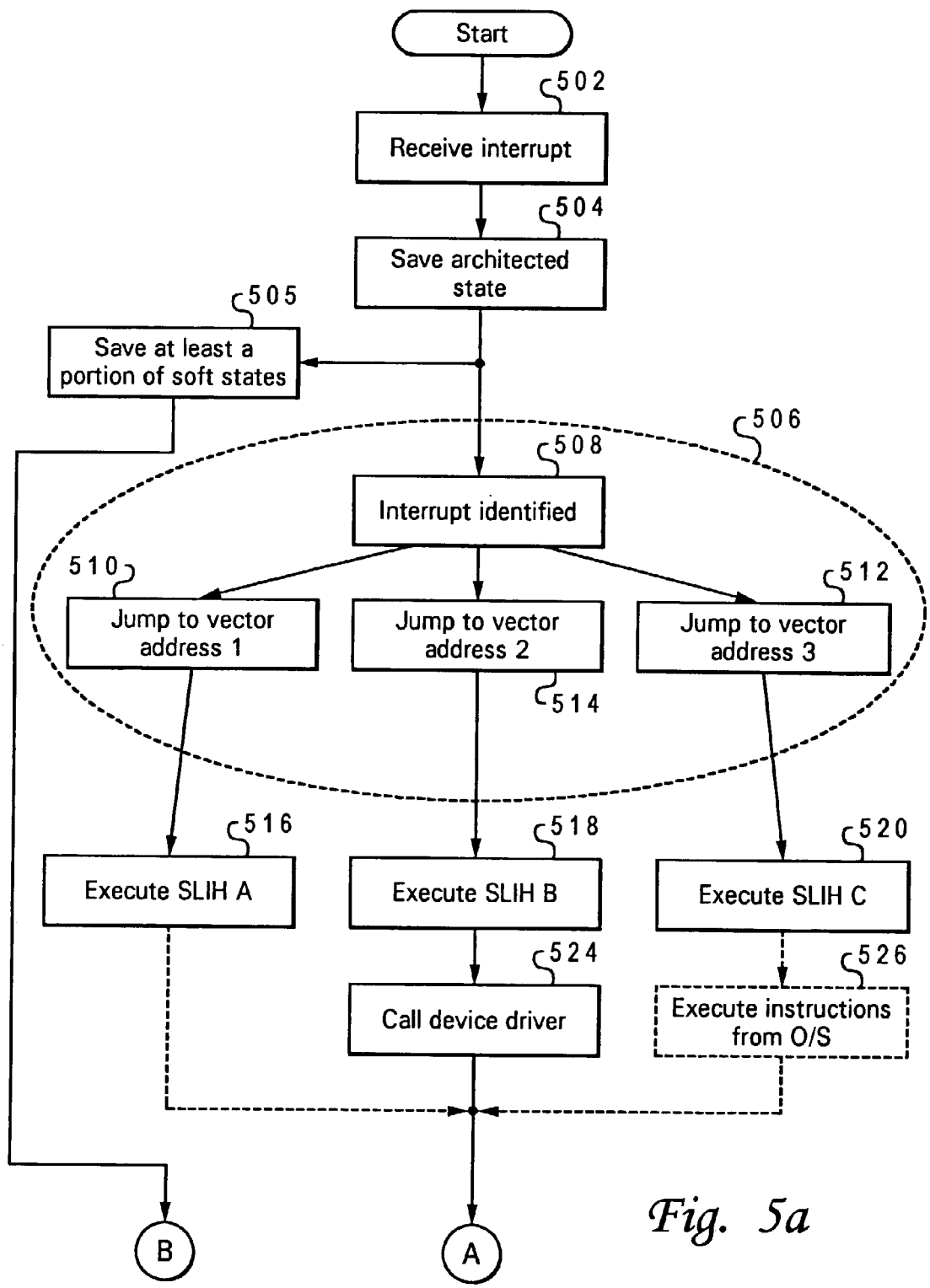
FIGS. 5a and 5b together form a flowchart of an exemplary interrupt handling process in accordance with the present invention.
Figure 5B:
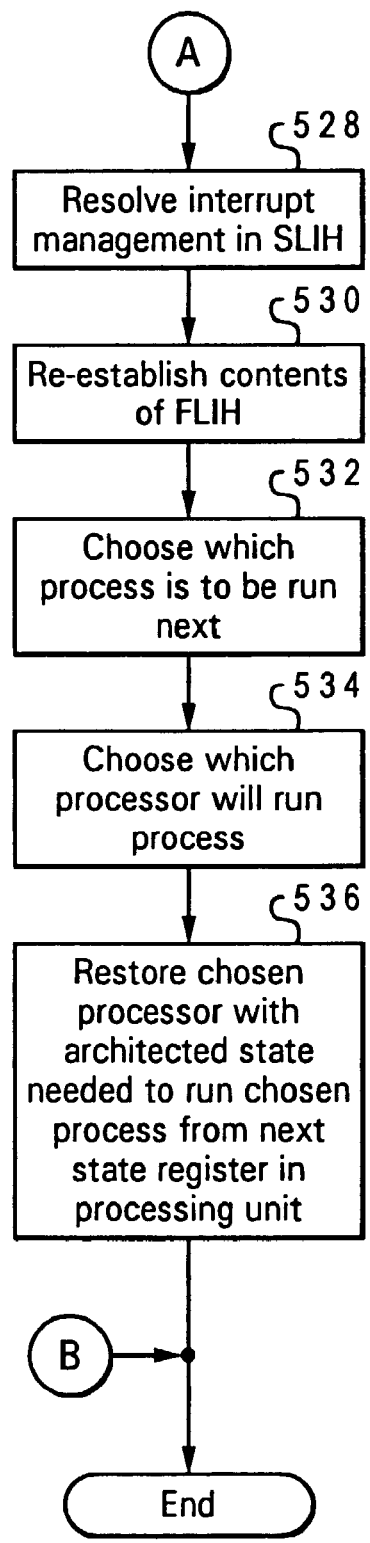

Referring now to FIGS. 5*a* and 5*b,* there is depicted a flowchart of an exemplary method by which a processing unit, such as processing unit 200, handles an interrupt in accordance with the present invention. As shown at block 502, an interrupt is received by the processor. This interrupt may be an exception (e.g., overflow), an external interrupt (e.g., from an I/O device) or an internal interrupt.

Figure 6A:
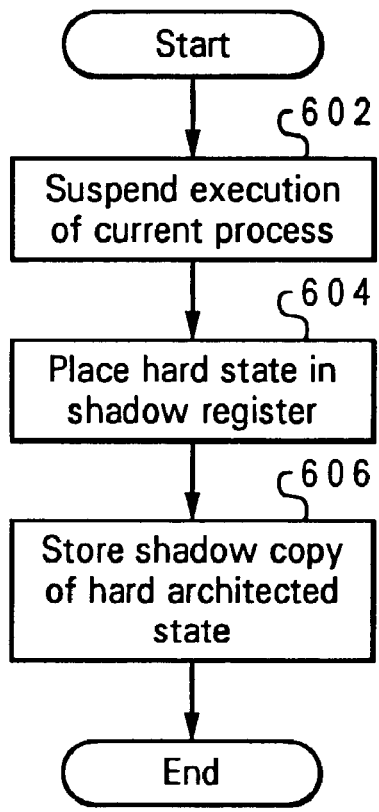
FIGS. 6a and 6b are flowcharts showing further detail of the step shown in FIG. 5a for saving a hard architected state and soft state in accordance with the present invention.

Upon receiving the interrupt, the hard architected state (block 504) and soft state (block 505) of the currently running process are saved. Details of preferred processes for saving and managing hard and soft states in accordance with the present invention are described below with reference to FIG. 6*a* (hard) and FIG. 6*b* (soft). After the hard state of the process is saved to memory, at least a First Level Interrupt Handler (FLIH) and Second Level Interrupt Handler (SLIH) are executed to service the interrupt.

The FLIH is a routine that receives control of the processor as a result of an interrupt. Upon notification of an interrupt, the FLIH determines the cause of the interrupt by reading an interrupt controller file. Preferably, this determination is made through the use of a vector register. That is, the FLIH reads a table to match an interrupt with an exception vector address that handles the initial processing of the interrupt.

The SLIH is a interrupt-dependent routine that handles the processing of an interrupt from a specific interrupt source. That is, the FLIH calls the SLIH, which handles the device interrupt, but is not the device driver itself.

In FIG. 5*a,* steps shown within circle 506 are performed by the FLIH. As illustrated at block 508, the interrupt is uniquely identified, as described above, preferably using a vector register. This interrupt identification then causes the processor to jump to a particular address in memory, depending on which interrupt is received.

As is well understood by those skilled in the art, any SLIH may establish a communication procedure with an input/output (I/O) device or with another processor (external interrupt), or may execute a set of instructions under the control of the operating system or hypervisor controlling the interrupted processor. For example, a first interrupt may cause the processor to jump to vector address 1, which results in the execution of SLIH A, as shown in blocks 510 and 516. As shown, SLIH A completes the handling of the interrupt without calling any additional software routine. Similarly, as illustrated in blocks 512, 520 and 526, a branch to vector address 3 results in the execution of exemplary SLIH C, which then executes one or more instructions belonging to the operating system 404 or hypervisor 402 (both shown in FIG. 4) to service the interrupt. Alternatively, if the interrupt instructs the processor to jump to vector address 2, then exemplary SLIH B is executed, as shown in blocks 514 and 518. SLIH B then calls (block 524) a device driver for the device that issued the interrupt.

Following any of block 516, 524 or 526, the process proceeds through page connector "A" to block 528 of FIG. 5*b*. Once the interrupt has been serviced, then the SLIH and FLIH are resolved and re-established to reflect the execution and completion of the interrupt, as shown in blocks 528 and 530. Thereafter, a next process is loaded and run, as described in blocks 532-536. The interrupt handling process then terminates.

A choice is made, typically by the operating system of the processor or by the hypervisor of the MP computer system of which the processor is a part, as to which process is run next (block 532) and on which processor (block 534) (if in a MP computer system). The selected process may be the process that was interrupted on the present processor, or it may be another process that is new or was interrupted while executing on the present processor or on another processor.

As illustrated in block 536, once the process and processor are selected, that chosen processor is initialized with the state of the next process to be run using the next hard state register 210 shown in FIG. 2. Next hard state register 210 contains the hard architected state of the next "hottest" process. Usually, this next hottest process is a process that was previously interrupted, and is now being resumed. Rarely, the next hottest process may be a new process that had not been previously interrupted.

The next hottest process is the process that is determined to have the highest priority for execution. Priority may be based on how critical a process is to the overall application, a need for a result from the process, or any other reason for prioritization. As multiple processes are run, priorities of each process waiting to resume often change. Thus, the hard architected states are dynamically assigned updated priority levels. That is, at any given moment, next hard state register 210 contains hard architected state that is continuously and dynamically updated from system memory 118 to contain the next "hottest" process that needs to be run.

Saving Hard Architected State

In the prior art, the hard architected state is stored to system memory through the load/store unit of the processor core, which blocks execution of the interrupt handler or another process for a number of processor clock cycles. In the present invention, the step of saving a hard state as depicted in block 504 of FIG. 5*a* is accelerated according to the method illustrated in FIG. 6*a,* which is described with reference to hardware schematically illustrated in FIG. 2.

Upon receipt of an interrupt, processing unit 200 suspends execution of a currently executing process, as illustrated in block 602. The hard architected state stored in hard state registers 206 is then copied directly to shadow register 208, as illustrated in block 604. (Alternatively, shadow registers 208 already have a copy of the hard architected state through a process of continually updating shadow registers 208 with the current hard architected state.) The shadow copy of the hard architected state, which is preferably non-executable when viewed by the processing unit 200, is then stored to system memory 118 under the control of IMC 220, as illustrated at block 606. The shadow copy of the hard architected state is transferred to system memory 118 via high bandwidth memory bus 116. Since storing the copy of the current hard architected state into shadow register 208 takes only a few clock cycles at most, processing unit 200 is quickly able to begin the "real work" of handling the interrupt or executing a next process.

The shadow copy of the hard architected state is preferably stored in a special memory area within system memory 118 that is reserved for hard architected states, as described below with respect to FIG. 10.

Saving Soft State

When an interrupt handler is executed by a conventional processor, the soft state of the interrupted process is typically polluted. That is, execution of the interrupt handler software populates the processor's caches, address translation facilities, and history tables with data (including instructions) that are used by the interrupt handler. Thus, when the interrupted process resumes after the interrupt is handled, the process will experience increased instruction and data cache misses, increased translation misses, and increased branch mispredictions. Such misses and mispredictions severely degrade process performance until the information related to interrupt handling is purged from the processor and the caches and other components storing the process' soft state are repopulated with information relating to the process. The present invention therefore saves and restores at least a portion of a process' soft state in order to reduce the performance penalty associated with interrupt handling.

Figure 6B:
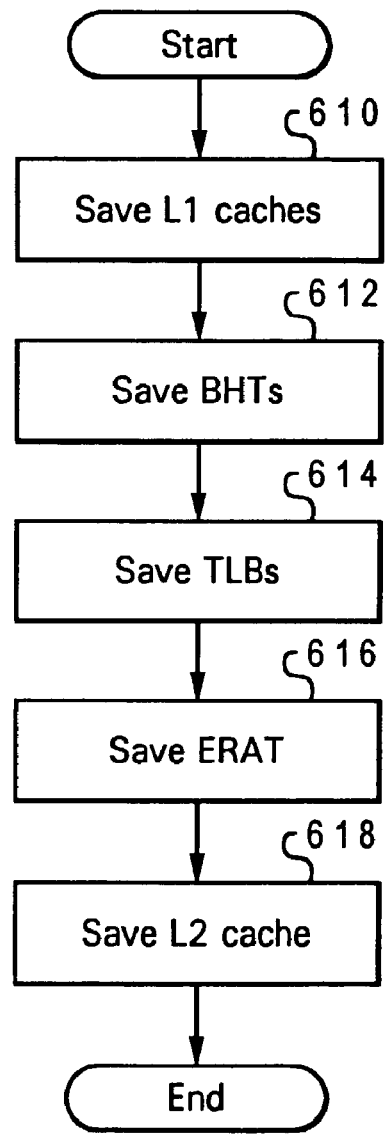

With reference now to FIG. 6b and corresponding hardware depicted in FIGS. 2 and 3a, the entire contents of L1 I-cache 18 and L1 D-cache 20 are saved to a dedicated region of system memory 118, as illustrated at block 610. Likewise, contents of BHT 35 (block 612), ITLB 115 and DTLB 113 (block 614), ERAT 32 (block 616), and L2 cache 16 (block 618) maybe saved to system memory 118.

Because L2 cache 16 maybe quite large (e.g., several megabytes in size), storing all of L2 cache 16 may be prohibitive in terms of both its footprint in system memory and the time/bandwidth required to transfer the data. Therefore, in a preferred embodiment, only a subset (e.g., two) of the most recently used (MRU) sets are saved within each congruence class.

It should be understood that although FIG. 6b illustrates the saving of each of a number of different components of the soft state of a process, the number of these components that is saved and the order in which the components are saved can vary between implementation and can be software programmable or controlled through hardware mode bits.

Thus, the present invention streams out soft states while the interrupt handler routines (or next process) are being executed. This asynchronous operation (independent of execution of the interrupt handlers) may result in an intermingling of soft states (those of the interrupted process and those of the interrupt handler). Nonetheless, such intermingling of data is acceptable because precise preservation of the soft state is not required for architected correctness and because improved performance is achieved due to the shorter delay in executing the interrupt handler.

Referring again to FIG. 2, soft states from L1 I-cache 18, L1 D-cache 20, and L2 cache 16 are transmitted to IMC 220 via cache data path 218, while other soft states such as BHT 35 are transmitted to IMC 220 via analogous internal data paths (not shown). Alternatively or additionally, in a preferred embodiment, at least some soft state components are transmitted to IMC 220 via scan chain pathway 214.

Saving Soft States Via a Scan Chain Pathway

Because of their complexity, processors and other ICs typically include circuitry that facilitates testing of the IC. The test circuitry includes a boundary scan chain as described in the Institute of Electrical and Electronic Engineers (IEEE) Standard 1149.1-1990, "Standard Test Access Port and Boundary Scan Architecture," which is herein incorporated by reference in its entirety. The boundary scan chain which is typically accessed through dedicated pins on a packaged integrated circuit, provides a pathway for test data between components of an integrated circuit.

Figure 7:
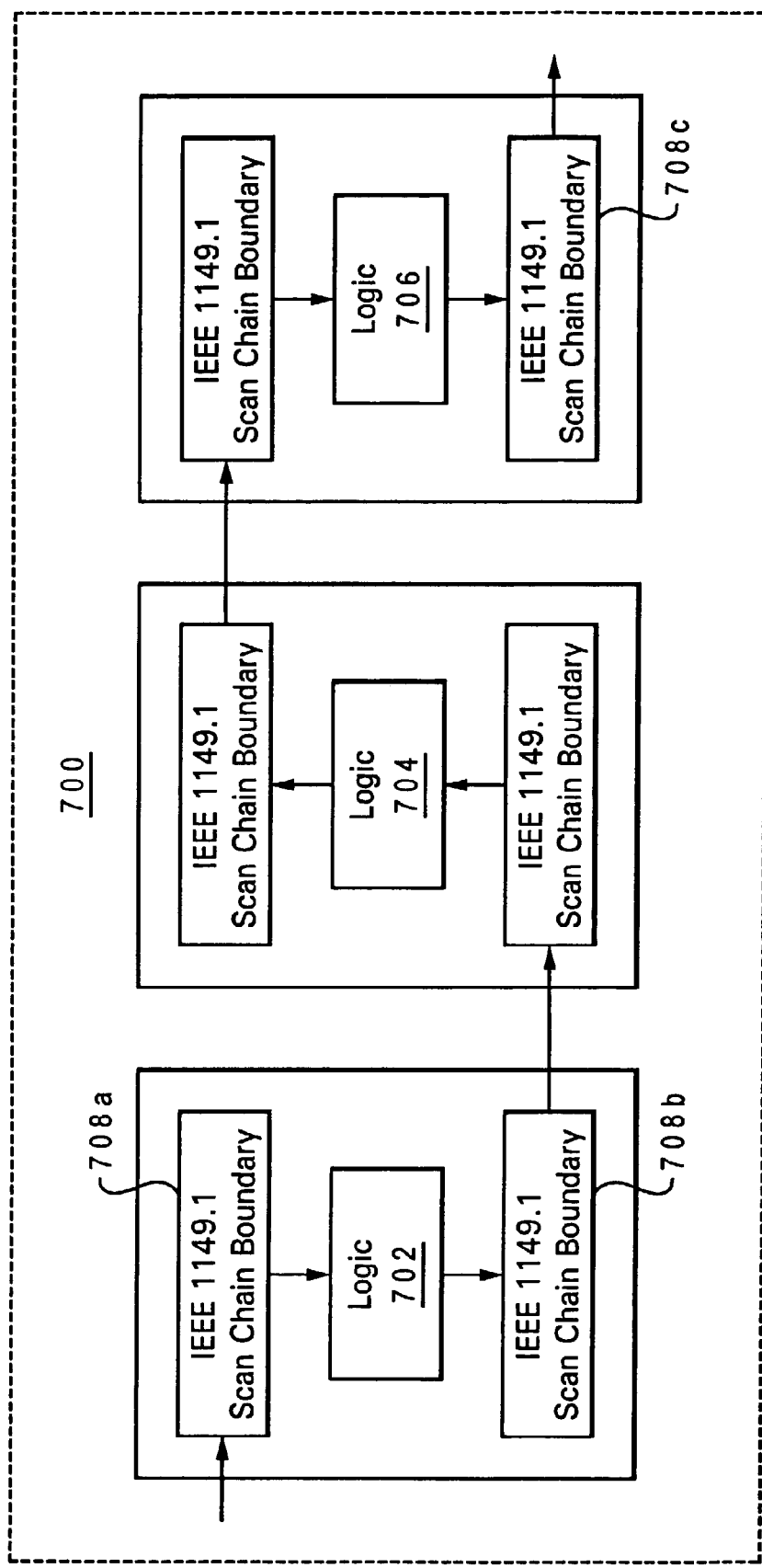
FIG. 7 depicts scan chain pathways used by the present invention to communicate at least the soft state of a process to memory.

With reference now to FIG. 7, there is depicted a block in accordance with the diagram of an integrated circuit 700 in accordance with the present invention. Integrated circuit 700 is preferably a processor, such as processing unit of 200 of FIG. 2. Integrated circuit 700 contains three logical components (logic) 702, 704 and 706, which, for purposes of explaining the present invention, comprise three of the memory elements that store the soft state of the process. For example, logic 702 may be L1 D-cache 20 shown in FIG. 3a, logic 704 may be ERAT 32, and logic 706 may be a portion of L2 cache 16 as described above.

During manufacturer testing of integrated circuit 700, a signal is sent through the scan chains boundary cells 708, which are preferably clock controlled latches. A signal output by scan chain boundary cell 708a provides a test input to logic 702, which then outputs a signal to scan chain boundary cells 708b, which in turn sends the test signal through other logic (704 and 706) via other scan chain boundary cells 708 until the signal reaches scan chain boundary 708c. Thus, there is a domino effect, in which logic 702–706 pass the test only if the expected output is received from scan chain boundary cell 708c.

Historically, the boundary scan chain of an integrated circuit is unused after manufacture. The present invention, however, utilizes the described test pathway as a pathway to transfer the soft architected state to IMC 220 of FIG. 2 in a manner that is non-blocking of cache/register ports. That is, by using the scan chain test pathway, the soft architected state can be streamed out of the caches/registers while the IH or next process is executing without blocking access to the caches/registers by the next process or interrupt handler.

As scan chain 214 is a serial pathway, serial-to-parallel logic 216, illustrated in FIG. 2, provides parallel data to ICM 220 for proper transmission of the soft state to system memory 118. In a preferred embodiment, serial-to-parallel logic 216 also includes logic for both identifying which data is from which register/cache. Such identification may be by any method known to those skilled in the art, including identification of leading identification tags on the serial data, etc. After converting the soft state data to parallel format, IMC 220 then transmits the soft state to system memory 118 via high-bandwidth memory bus 222.

Note that these same scan chain pathways may be used further to transmit hard architected states such as contained in shadows register 208 depicted in FIG. 2.

SLIH/FLIH Flash ROM

In prior art systems, First Level Interrupt Handlers (FLIHs) and Second Level Interrupt Handlers (SLIHs) are stored in system memory, and populate the cache memory hierarchy when called. Initially calling a FLIH or SLIH from system memory in a conventional system result in a long access latency (to locate and load the FLIH/SLIH from system memory after a cache miss). Populating cache memory with FLIH/SLIH instructions and data "pollutes" the cache with data and instructions that are not needed by subsequent processes.

Figure 8A:
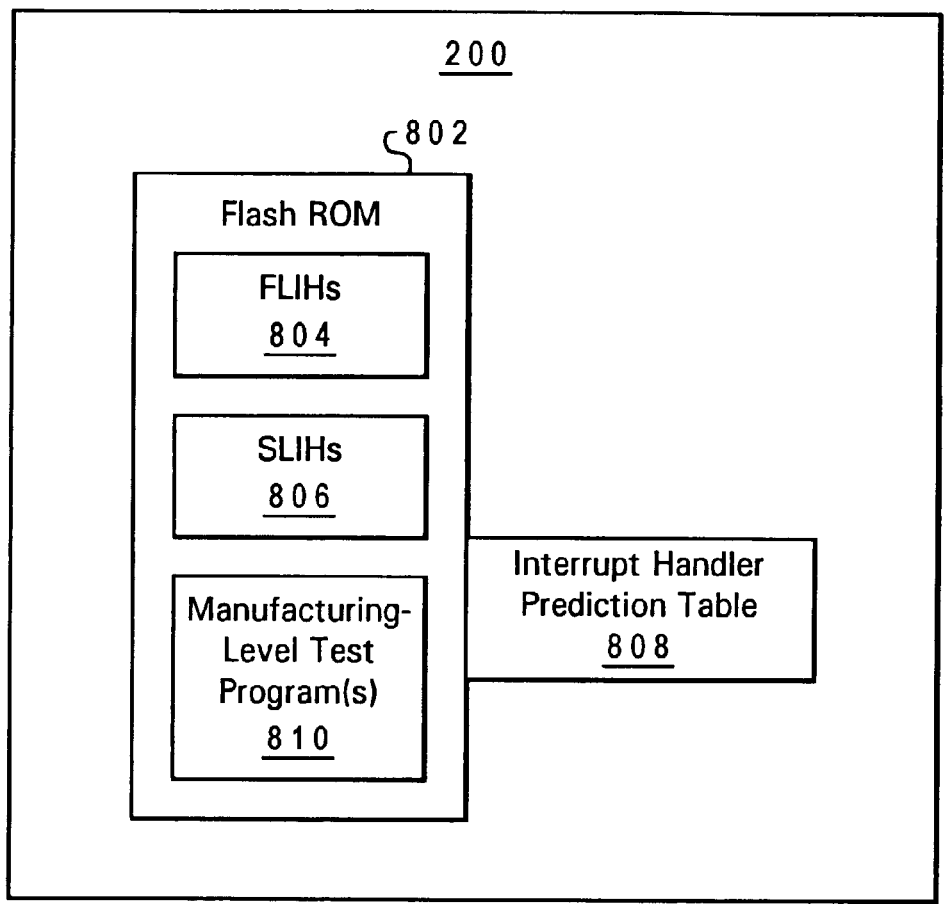
FIGS. 8a–8c illustrate additional detail of a flash ROM depicted in FIG. 2 used in accordance with the present invention to store at least First Level Interrupt Handlers (FLIHs), Second Level Interrupt Handlers (SLIHs) and manufacturing-level test instructions.

To reduce the access latency of FLIHs and SLIHs and to avoid cache pollution, processing unit 200 stores at least some FLIHs and SLIHs in a special on-chip memory (e.g., flash Read Only Memory (ROM) 802), as depicted in FIGS. 3a and 8a. FLIHs 804 and SLIHs 806 may be burned into flash ROM 802 at the time of manufacture, or may be burned in after manufacture by flash programming techniques well known to those skilled in the art. When an interrupt is received by processing unit 200 (depicted in FIG. 2), the FLIH/SLIH is directly accessed from flash ROM 802 rather than from system memory 118 or cache hierarchy 212.

SLIH Prediction

Normally, when an interrupt occurs in processing unit 200, a FLIH is called, which then calls a SLIH, which completes the handling of the interrupt. Which SLIH is called and how that SLIH executes varies, and is dependent on a variety of factors including parameters passed, conditions states, etc. For example, in FIG. 8b, calling FLIH 812 results in the calling and execution of SLIH 814, which results in executing instructions located at point B.

Because program behavior can be repetitive, it is frequently the case that an interrupt will occur multiple times, resulting in the execution of the same FLIH and SLIH (e.g., FLIH 812 and SLIH 814). Consequently, the present invention recognizes that, interrupt handling for subsequent occurrences of an interrupt may be accelerated by predicting that the control graph of the interrupt handling process will be repeated and by speculatively executing portions of the SLIH without first executing the FLIH.

Figure 8B:
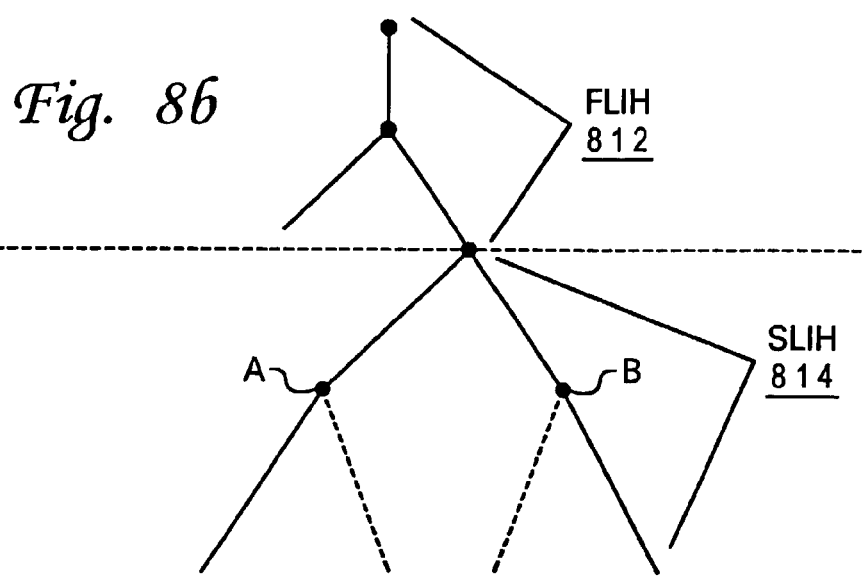
Figure 8C:
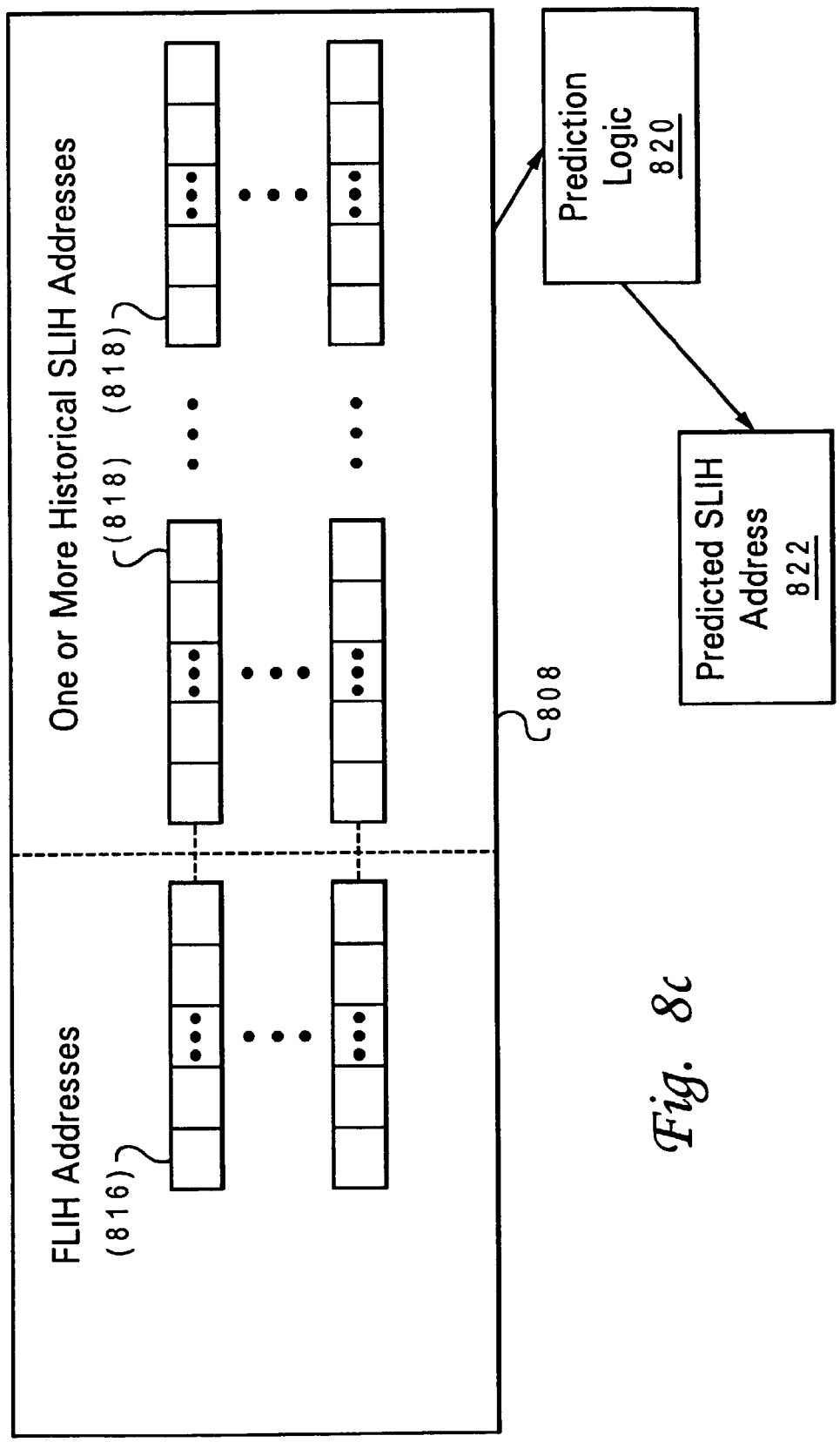

To facilitate interrupt handling prediction, processing unit 200 is equipped with an Interrupt Handler Prediction Table (IHPT) 808, shown in greater detail in FIG. 8c. IHPT 808 contains a list of the base addresses 816 (interrupt vectors) of multiple FLIHs. In association with each FLIH address 816, IHPT 808 stores a respective set of one or more SLIH addresses 818 that have previously been called by the associated FLIH. When IHPT 808 is accessed with the base address for a specific FLIH, prediction logic 820 selects a SLIH address 818 associated with the specified FLIH address 816 in IHPT 808 as the address of the SLIH that will likely be called by the specified FLIH. Note that while the predicted SLIH address illustrated may be the base address of SLIH 814 as indicated in FIG. 8b, the address may also be an address of an instruction within SLIH 814 subsequent to the starting point (e.g., at point B).

Prediction logic 820 uses an algorithm that predicts which SLIH will be called by the specified FLIH. In a preferred embodiment, this algorithm picks a SLIH, associated with the specified FLIH, that has been used most recently. In another preferred embodiment, this algorithm picks a SLIH, associated with the specified FLIH, that has historically been called most frequently. In either described preferred embodiment, the algorithm may be run upon a request for the predicted SLIH, or the predicted SLIH may be continuously updated and stored in IHPT 808.

It is significant to note that the present invention is different from branch prediction methods known in the art. First, the method described above results in a jump to a specific interrupt handler, and is not based on a branch instruction address. That is, branch prediction methods used in the prior art predict the outcome of a branch operation, while the present invention predicts a jump to a specific interrupt handler based on a (possibly) non-branch instruction. This leads to a second difference, which is that a greater amount of code can be skipped by interrupt handler prediction as taught by the present invention as compared to prior art branch prediction, because the present invention allows bypassing any number of instructions (such as in the FLIH), while a branch prediction permits bypassing only a limited number of instructions before the predicted branch due to inherent limitations in the size of the instruction window that can be scanned by a conventional branch prediction mechanism. Third, interrupt handler prediction in accordance with the present invention is not constrained to a binary determination as are the taken/not taken branch predictions known in the prior art. Thus, referring again to FIG. 8c, prediction logic 820 may choose predicted SLIH address 822 from any number of historical SLIH addresses 818, while a branch prediction scheme chooses among only a sequential execution path and a branch path.

Figure 9:
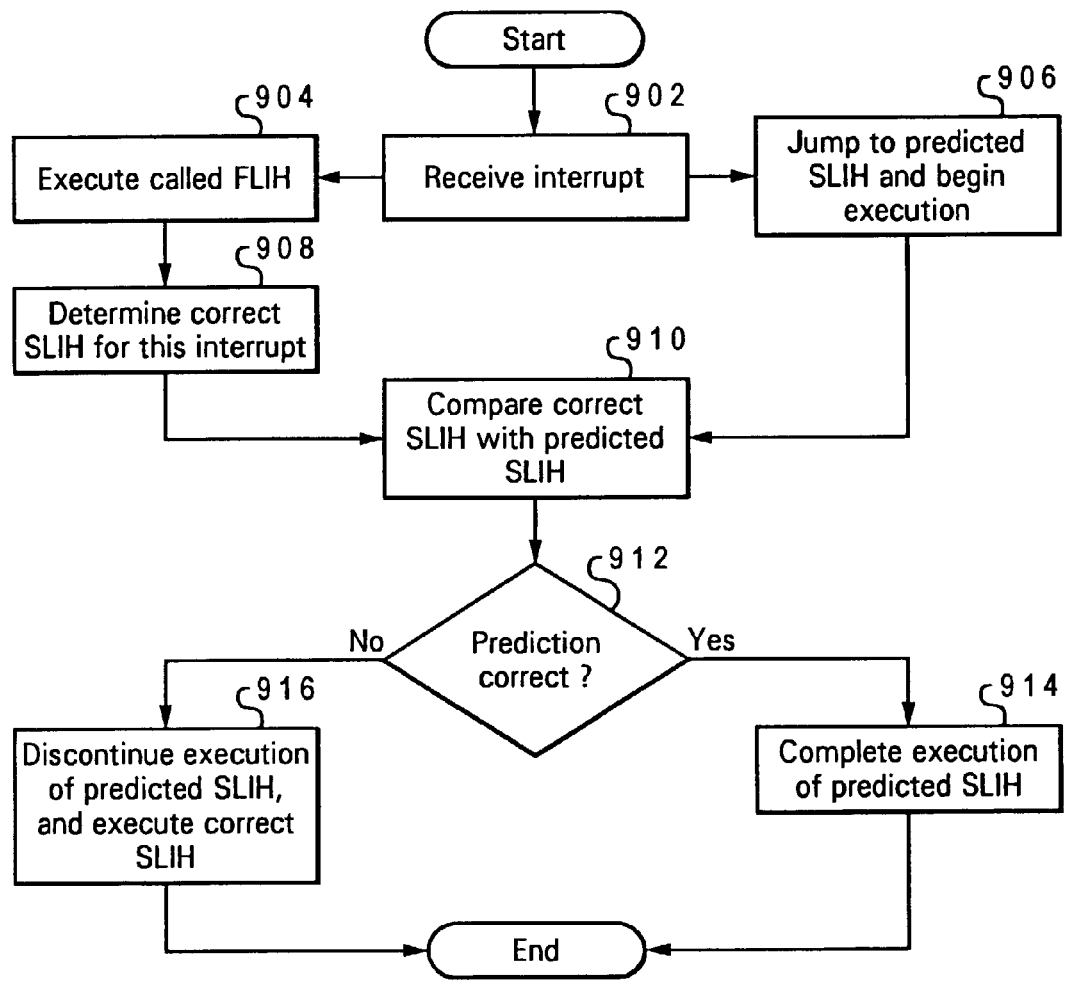
FIG. 9 is a flow-chart describing jumping to a predicted SLIH upon receipt of an interruption by a processor in accordance with the present invention.

Reference is now made to FIG. 9, which illustrates a flowchart of an exemplary method of predicting an interrupt handler in accordance with the present invention. When an interrupt is received by a processor (block 902), concurrent execution by simultaneous multithreading (SMT) begins on both the FLIH called by the interrupt (block 904) as well as a predicted SLIH (block 906) indicated by IHPT 808 based upon prior execution history.

In a preferred embodiment, jumping to the predicted SLIH (block 906) may be performed in response to monitoring, upon receipt of an interrupt, the called FLIH. For example, refer again to IHPT 808, shown in FIG. 8. When the interrupt is received, the FLIH is compared to FLIH addresses 816 stored in IHPT 808. If a comparison of the stored FLIH addresses 816 in IHPT 808 reveals the same FLIH address called by the interrupt, then IHPT 808 provides the predicted SLIH address 822, and code execution starting at the address of the predicted SLIH address 822 immediately begins.

Subsequent comparison of the known correct SLIM and the predicted SLIH is preferably performed by storing the predicted SLIH address 822, that was called using IHPT 808, in a SLIH prediction register containing FLIH addresses with a prediction flag. In a preferred embodiment of the present invention, when a instruction known to call a SLIH from the FLIH, such as a "jump" instruction, is executed, the address called by the jump is compared with address of the predicted SLIH address 822 located in the prediction register (and identified as having been predicted and currently executing by the prediction flag). The predicted SLIH address 822 from the prediction register and the SLIH selected to by the executing FLIH are compared (block 910). If the correct SLIH was predicted, then the predicted SLIH completes execution (block 914), thus accelerating interrupt handling. If, however, the SLIH was mispredicted, then further execution of the predicted SLIH is cancelled, and the correct SLIH is execution instead (block 916).

State Management

Figure 10:
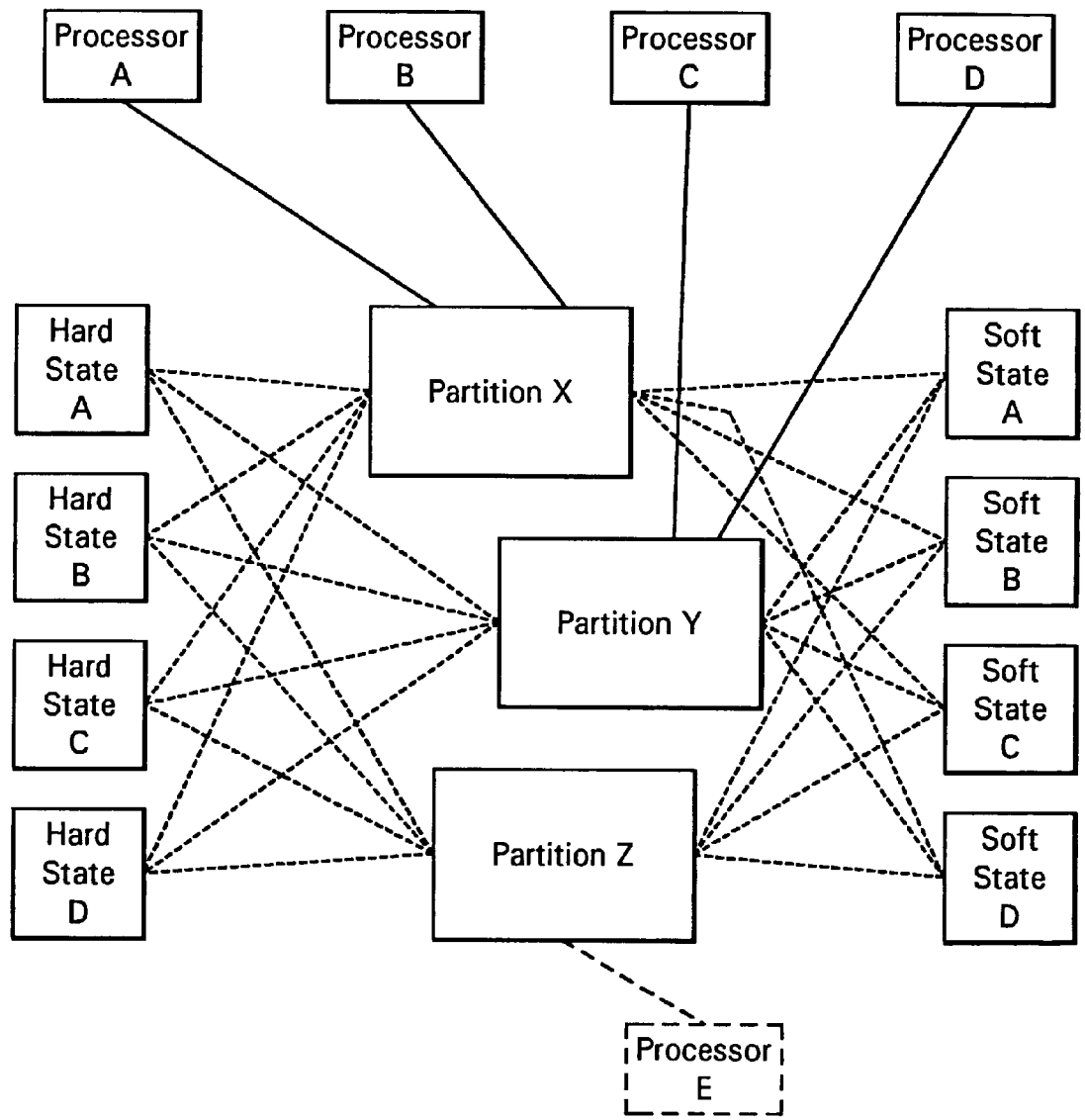
FIG. 10 depicts the logical and communicative relationship between stored hard architected states, stored soft states, memory partitions and processors.

Referring now to FIG. 10, there is depicted a conceptual diagram that graphically illustrates the logical relationship between hard and soft states stored in system memory and various processors and memory partitions of an exemplary MP data processing system. As shown in FIG. 10, all hard architected states and soft states are stored in a special memory region allocated by hypervisor 402 that is accessible by processors within any partition. That is, Processor A and Processor B may initially be configured by hypervisor 402 to function as an SMP within Partition X, while Processor C and Processor D are configured as an SMP within Partition Y. While executing, processors A–D may be interrupted, causing each of processors A–D to store a respective one of hard states A–D and soft states A–D to memory in the manner discussed above. Unlike prior art systems that do not permit processors in different partitions to access the same memory space, any processor can access any of hard or soft states A–D to resume the associated interrupted process. For example, in addition to hard and soft states C and D, which were created within its partition, Processor D can also access hard and soft states A and B. Thus, any process state can be accessed by any partition or processor(s). Consequently, hypervisor 402 has great freedom and flexibility in load balancing between partitions.

Soft State Cache Coherency

As discussed above, soft states of interrupted processes may include the contents of cache memory, such as L1 I-cache 18, L2 D-cache 20 and L2 cache 16 illustrated in FIG. 3a. While these soft states are stored in system memory, as described above with reference to FIG. 6b, it is likely that at least some of the data comprising the soft states will become stale due to data modifications made by other processes. The present invention therefore provides a mechanism to keep the soft states stored in system memory cache coherent.

Figure 11:
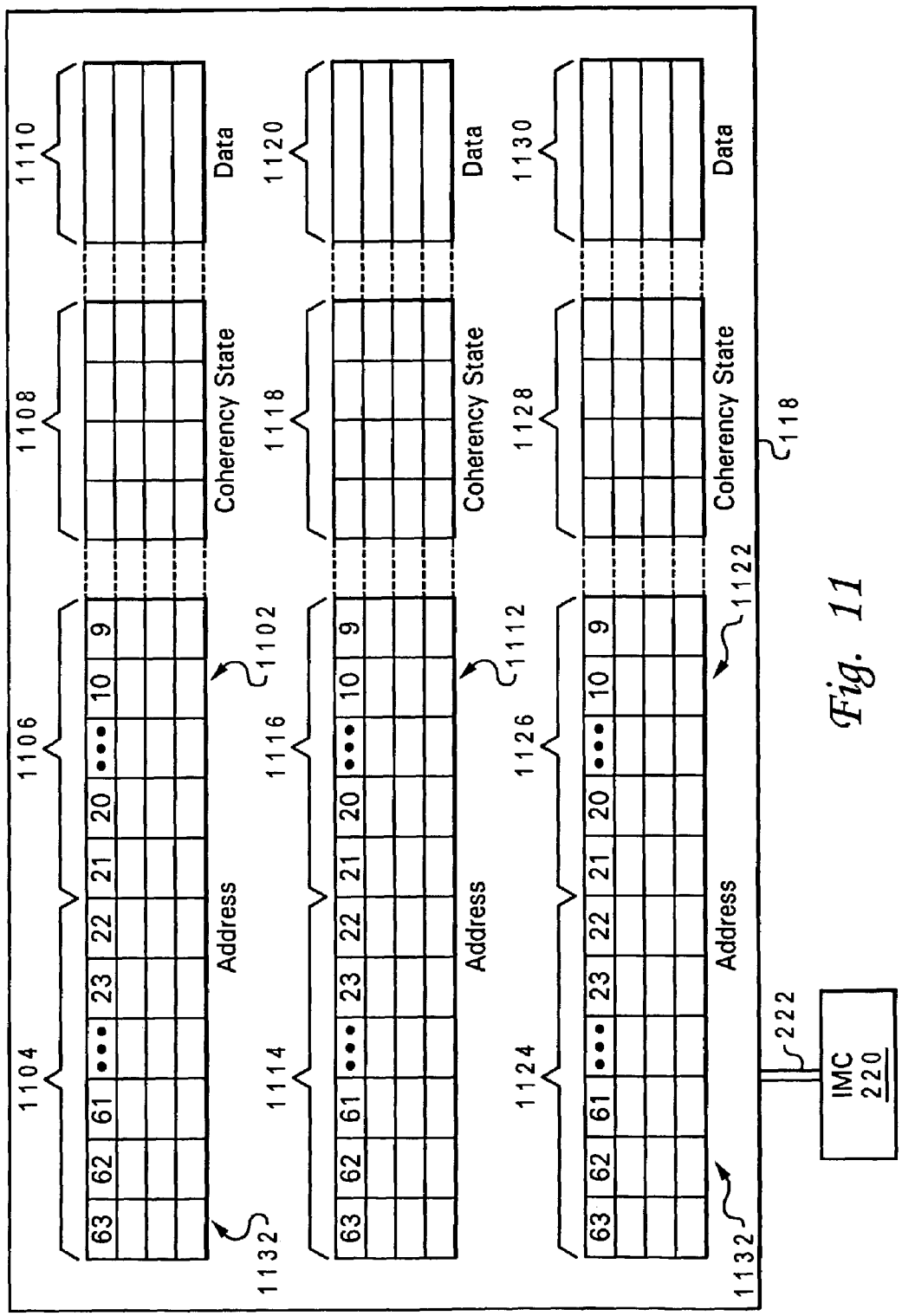
FIG. 11 illustrates an exemplary data structure for storing soft state in memory.

As illustrated in FIG. 11, the soft states stored in system memory 118 can be conceptualized as being stored in "virtual caches". For example, the soft state of L2 cache 16 is in L2 virtual cache 1102. L2 virtual cache comprises an address portion including the tag 1104 and index 1106 of each cache line of data 1110 saved from L2 cache 16. Similarly, L1 virtual I-cache 1112 comprises an address portion including the tag 1114 and index 1116, of instructions 1120 saved from L1 I-cache 18, and L1 virtual D-cache 1122 comprises an address portion, including a tag 1124 and index 1126 of each cache line of data 1130 saved from L1 D-cache 20. Each of these "virtual caches" is managed via interconnect 222 by integrated memory controller (IMC) 220 to maintain coherency.

IMC 220 snoops each operation on system interconnect 222. Whenever an operation is snooped that may require the invalidation of a cache line, IMC 220 snoops the operation against virtual cache directories 1132. If a snoop hit is detected, IMC 220 invalidates the virtual cache line in system memory 118 by updating the appropriate virtual cache directory. Although it is possible to require exact address matches for snoop invalidates (i.e., matches of both tag and index), implementing a precise address match would require a large amount of circuitry in IMC 220 (particularly for 64-bit and larger addresses). Accordingly, in a preferred embodiment, snoop invalidations are imprecise, and all virtual cache lines having selected most significant bits (MSBs) matching the snooped address are invalidated. Which MSBs are used to determine which cache lines are invalidated in the virtual cache memories is implementation-specific and may be software-controllable or hardware controllable via mode bits. Thus, addresses may be snooped against the tag or only a portion of the tag (such as the 10 most significant bits). Such an invalidation scheme of the virtual cache memory has an admitted disadvantage of invalidating cache lines that still contain valid data, but this disadvantage is outweighed by the performance advantage achieved by providing a very fast method of maintaining coherency of virtual cache lines.

Manufacturing Level Test

During manufacturing, integrated circuits are subjected to a battery of tests under a variety of operating conditions. One such test is a data test in which the internal gates of the integrated circuit are all tested with a test data stream using the IEEE 1149.1 test scan chain described above. In the prior art, after installation of the integrated circuit in an operating environment such test programs are not run again, in part because it is impractical in most operating environments to connect the integrated circuit to a test fixture to perform the test and because such testing prevents use of the integrated circuit for its intended purpose. For example, in processor 100 the hard architected state must be saved to and restored from system memory via the load/store execution path, preventing the accomplishment of substantive work during testing and introducing significant latency.

Using the hard architected state storage method described above, however, a processor can run a manufacturing-level test program routinely while the processor is installed in a normal operating environment (e.g., a computer system) since the time to save and restore the hard architected state is very short, preferably just a few clock cycles.

Figure 12:
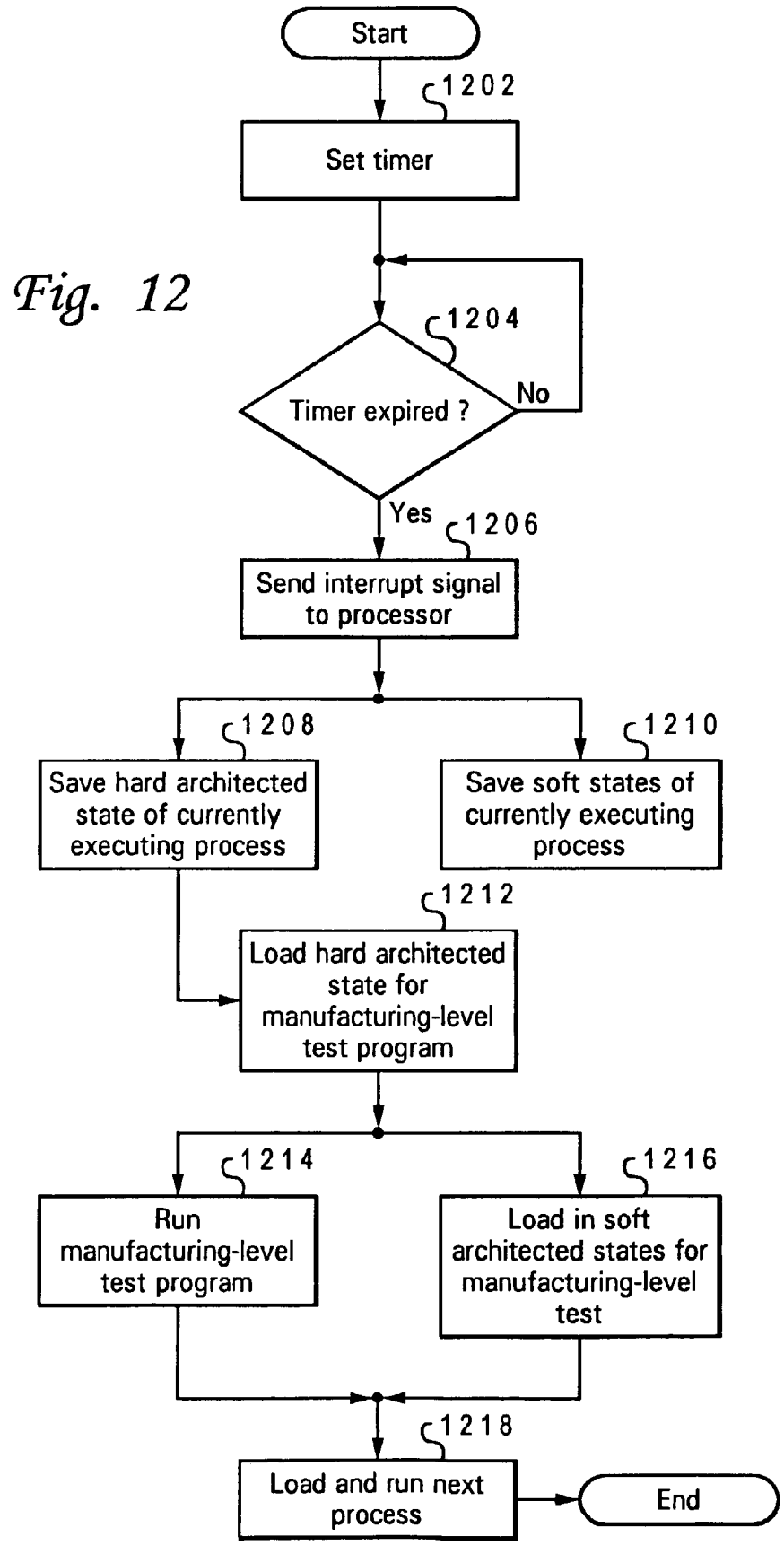
FIG. 12 is a flowchart of an exemplary method for testing a processor through execution of a manufacturing level test program during normal operation of a computer system.

With reference now to FIG. 12, there is depicted a flow-chart of an exemplary method of manufacturing-level test program in accordance with the present invention. Test programs are preferably run periodically. Thus, as depicted in blocks 1202 and 1204, upon passage of a predetermined amount of time, an interrupt is initiated in the processor (block 1206). As with any interrupt using the present invention, when the test program begins running and issues the interrupt, the hard architected state of the currently executing process is immediately saved (generally within 2–3 clock cycles), using the preferred method described above for saving hard architected states, as depicted in block 1208. Concurrently, at least a portion of the soft state for the currently executing process is saved (block 1210), preferably in a manner described above in FIG. 6b.

The hard architected state for the manufacturing test program is optionally loaded into the processor, as described in block 1212. In a preferred embodiment of the present invention, the manufacturing-level test program is loaded from a manufacturing-level test program(s) 810 loaded from flash ROM 802, depicted in FIG. 8a. Manufacturing-level test program(s) 810 may be burned into flash ROM 802 when processing unit 200 is first manufactured, or the manufacturing-level test program(s) 810 may be burned in subsequently. If multiple manufacturing-level test programs are stored in flash ROM 802, then one of the manufacturing-level test programs is selected for execution. In a preferred embodiment of with the present invention, the manufacturing-level test program is run each time a timer interrupt is executed, as described above for blocks 1202 and 1204.

As soon as the hard architected state is loaded into the processor, the manufacturing level test program begins to run (block 1214), preferably using the IEEE 1149.1 test scan chain described above. Concurrently, the soft architected states flow into the processor (block 1216), preferably in the manner described above for soft state updating (FIG. 6b). Upon completion of the execution of the manufacturing level test program, the interrupt is complete, and a next process is executed by loading the hard architected state and soft states for that process (block 1218).

As the loading of the hard architected states require only a few clock cycles, the manufacturing level test program can be run as often as the designer wishes, within the constraints of the time required to execute the test program itself. The execution of the manufacturing test program can be initiated by the user, the operating system, or the hypervisor.

Thus, the present invention provides a method and system to address, among other matters, the problem of latency associated with interrupts. For example, in the prior art, if the interrupt handler is a process that is infrequently called, then typically there is a long latency as lower cache levels, and even system memory, are searched for the appropriate interrupt handler. When the interrupt handler is executing, it populates the processor's cache hierarchy with instructions/data needed to handle the interrupt, thus "polluting" the cache hierarchy when the interrupted process is restored for execution. The present invention solves these problems utilizing the inventive processes described herein.

Although aspects of the present invention have been described with respect to a computer processor and software, it should be understood that at least some aspects of the present invention may alternatively be implemented as a program product for use with a data storage system or computer system. Programs defining functions of the present invention can be delivered to a data storage system or computer system via a variety of signal-bearing media, which include, without limitation, non-writable storage media (e.g. CD-ROM), writable storage media (e.g. a floppy diskette, hard disk drive, read/write CD-ROM, optical media), and communication media, such as computer and telephone networks including Ethernet. It should be understood, therefore, that such signal-bearing media, when carrying or encoding computer readable instructions that direct method functions of the present invention, represent alternative embodiments of the present invention. Further, it is understood that the present invention may be implemented by a system having means in the form of hardware, software, or a combination of software and hardware as described herein or their equivalent.

While the invention has been particularly shown and described with reference to a preferred embodiment, it will be understood by those skilled in the art that various changes in form and detail may be made therein without departing from the spirit and scope of the invention.

What is claimed is:

1. A method of managing state information in a processor, the method comprising:
    storing, within the processor, a current process' hard architected state that is critical for executing a currently executing process in the processor;
    storing, within the processor, a shadow copy of the current process' hard architected state;
    in response to receiving a process interrupt at the processor, storing the shadow copy of the current process' hard architected state in a memory; and
    in response to receiving the process interrupt at the processor, replacing the current process' hard architected state with a next process' hard architected state without regard to completion of the storing of the shadow copy in the memory.

2. The method of claim 1, wherein the replacing step comprises replacing the current process' hard architected state prior to completion of the storing of the shadow copy in the memory.

3. The method of claim 1, wherein the shadow copy of the current process' hard architected state is updated in response to the process interrupt.

4. The method of claim 1, further comprising continuously updating the shadow copy in response to each replacement of the current process' hard architected state.

5. The method of claim 1, wherein the processor has an associated memory hierarchy of volatile memory, the hierarchy including a highest level having a lowest latency and a lowest level having a highest latency, the storing step storing the shadow copy of the current process' hard architected state in the lowest level of the volatile memory.

6. The method of claim 1, further comprising executing an interrupt handler to service the process interrupt.

7. The method of claim 1, wherein the processor includes execution circuit for executing memory access instructions, the method further comprising storing the shadow copy in the memory independently of execution of memory access instructions by the execution circuitry.

8. A processor comprising:
    at least one execution unit;
    an instruction sequencing unit coupled to the at least one execution unit;
    a first register set coupled to the at least one execution unit, wherein the first register set contains at least a portion of a current process' hard architected state that is critical for executing a currently executing process in the processor;
    a corresponding shadow register set coupled to the first register set, the shadow register set containing a shadow copy of the at least a portion of the current process' hard architected state contained in the first register set; and
    a memory controller coupled to the shadow register, wherein the processor, in receipt of a process interrupt, stores the shadow copy of the current process' hard architected state to a memory, and wherein the shadow copy of the current process' hard architected state is stored to the memory without regard to a completion of a replacement of the current process' hard architected state with an architected state for a next process to run on the processor.

9. The processor of claim 8, further comprising:
    an associated volatile memory hierarchy including a highest level having a lowest latency and a lowest level having a highest latency, wherein the memory controller is
    coupled to the lowest level of the volatile memory hierarchy, and wherein the memory controller stores the current process' hard architected state in the lowest level of the volatile memory.

10. The processor of claim 8, further comprising means for updating the shadow copy of the current process' hard architected state in response to the process interrupt.

11. The processor of claim 8, further comprising means for continuously updating the shadow copy of the current process' hard architected state in response to each modification of the current process' hard architected state.

12. The processor of claim 8, further comprising:
    execution circuitry for executing memory access instructions, whereby the processor is capable of storing the shadow copy in the memory independently of execution of memory access instructions by the execution circuitry.

13. A data processing system comprising:
    a plurality of processors including a processor in accordance with claim 8;
    a volatile memory hierarchy coupled to the plurality of processors; and
    an interconnect coupling the plurality of processors.

14. A processor comprising:
    means for storing, within the processors, a current process' hard architected state that is critical for executing a currently executing process in the processor;
    means for storing, within the processor, a shadow copy of the current process' hard architected state;
    means, responsive to receiving a process interrupt at the processor, for storing the shadow copy of the current process' hard architected state in a memory; and
    means for in response to receiving the process interrupt at the processor, replacing the current process' hard architected state with a next process'hard architected state without regard to completion of the storing of the shadow copy in the memory.

15. The processor of claim 14, wherein the means for modifying the current process' hard architected state comprises means for modifying the current process' hard architected state prior to completion of the storing of the shadow copy in the memory.

16. The processor of claim 14, further comprising means for updating the shadow copy of the current process' hard architected state in response to the process interrupt.

17. The processor of claim 14, further comprising means for continuously updating the shadow copy in response to each modification of the current process'hard architected state.

18. The processor of claim 14, further comprising:
an associated volatile memory hierarchy including a highest level having a lowest latency and a lowest level having a highest latency; and
a memory controller, coupled to the lowest level of the volatile memory hierarchy, that stores the current process' hard architected state in the lowest level of the volatile memory.

19. The processor of claim 14, further comprising means for executing an interrupt handler to service the process interrupt.

20. The processor of claim 14, further comprising execution circuitry for executing memory access instructions, whereby the processor is capable of storing the shadow copy in the memory independently of execution of memory access instructions by the execution circuitry.

21. The processor of claim 14, further comprising:
an associated volatile memory hierarchy including a highest level having a lowest latency and a lowest level having a highest latency; and
a memory controller, coupled to the lowest level of the volatile memory hierarchy, that stores the current process' hard architected state in the lowest level of the volatile memory.

\* \* \* \* \*